United States Patent
Nagano et al.

(10) Patent No.: US 8,787,018 B2
(45) Date of Patent: Jul. 22, 2014

(54) POWER CONVERTING APPARATUS AND CAPACITOR COVER THEREOF

(75) Inventors: Sumiaki Nagano, Fukuoka (JP);
Kazutaka Kishimoto, Fukuoka (JP);
Makoto Kojyo, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 147 days.

(21) Appl. No.: 13/443,885

(22) Filed: Apr. 11, 2012

(65) Prior Publication Data

US 2012/0262877 A1    Oct. 18, 2012

(30) Foreign Application Priority Data

Apr. 18, 2011    (JP) ................................. 2011-091931

(51) Int. Cl.
*H05K 7/20*    (2006.01)
(52) U.S. Cl.
USPC ............................ 361/690; 361/678; 363/141
(58) Field of Classification Search
USPC ............ 361/679.48, 690, 694–695, 676–678; 363/141
See application file for complete search history.

(56) References Cited

U.S. PATENT DOCUMENTS

| | | | | |
|---|---|---|---|---|
| 2,819,915 A | * | 1/1958 | Woodson | 241/46.015 |
| 2,929,647 A | * | 3/1960 | Gladstone | 292/60 |
| 5,091,823 A | * | 2/1992 | Kanbara et al. | 361/697 |
| 6,817,695 B1 | * | 11/2004 | Aldrich et al. | 347/29 |
| 7,337,916 B2 | * | 3/2008 | Clougherty | 220/785 |
| 8,405,737 B2 | * | 3/2013 | Ezawa et al. | 348/222.1 |
| 8,570,767 B2 | * | 10/2013 | Schmit et al. | 361/821 |
| 2011/0069198 A1 | * | 3/2011 | Ezawa et al. | 348/222.1 |
| 2012/0262969 A1 | * | 10/2012 | Nagano et al. | 363/141 |

FOREIGN PATENT DOCUMENTS

| | | | | |
|---|---|---|---|---|
| JP | 51-135735 U | 11/1976 | | |
| JP | 02-290099 | 11/1990 | | |
| JP | 03-099971 | 4/1991 | | |
| JP | 04091416 A | * 3/1992 | | H01G 9/00 |
| JP | 05-198457 | 8/1993 | | |
| JP | 07-047051 | 2/1995 | | |

(Continued)

OTHER PUBLICATIONS

English machine translation of Takamasa, JP 05-198457 A, dated Aug 6, 1993, translated on Dec. 3, 2013.*

(Continued)

*Primary Examiner* — Robert J Hoffberg
(74) *Attorney, Agent, or Firm* — Mori & Ward, LLP

(57) ABSTRACT

A power converting apparatus includes a housing, a cylindrical capacitor, and a cylindrical capacitor cover. The housing includes a housing base, a main body, and an air duct. The main body includes a plurality of electronic components on a first surface of the housing base. The air duct is disposed on a second surface of the housing base. The capacitor penetrates through the housing base so that a part of the capacitor is disposed in the main body while a rest part of the capacitor is disposed in the air duct. The capacitor cover is disposed on the housing base and covers the rest part of the capacitor. The capacitor cover includes an elastic material and an inner surface. The capacitor cover includes a groove disposed on the inner surface in an axial direction of the capacitor cover.

16 Claims, 6 Drawing Sheets

(56) References Cited

FOREIGN PATENT DOCUMENTS

| | | |
|---|---|---|
| JP | 2000-173861 | 6/2000 |
| JP | 2000-238816 | 9/2000 |
| JP | 2006-287100 | 10/2006 |
| JP | 2007-281127 | 10/2007 |
| JP | 2010-162111 | 7/2010 |
| WO | WO 2010/116687 | 10/2010 |

OTHER PUBLICATIONS

English translation of Japanese publication, JP 4-91416 A, dated Mar. 24, 1992, translated on Dec. 2013.*
Japanese Office Action for corresponding JP Application No. 2011-091931, Sep. 24, 2013.
Japanese Office Action for corresponding JP Application No. 2011-091931, Jul. 1, 2013.
Japanese Office Action for corresponding JP Application No. 2011-091931, Apr. 24, 2013.

* cited by examiner

POWER CONVERTING APPARATUS AND CAPACITOR COVER THEREOF

CROSS-REFERENCE TO RELATED APPLICATIONS

The present application claims priority under 35 U.S.C. §119 to Japanese Patent Application No. 2011-091931, filed Apr. 18, 2011. The contents of this application are incorporated herein by reference in their entirety.

BACKGROUND OF THE INVENTION

1. Field of the Invention

The present invention relates to a power converting apparatus and a capacitor cover of the power converting apparatus.

2. Discussion of the Background

Generally, power converting apparatuses have cylindrical capacitors with comparatively large electrostatic capacities. To downsize the power converting apparatuses and to improve the cooling efficiency of capacitors, a commonly employed structure is that a capacitor is passed through the housing base so that a part of the capacitor resides in the main body while the rest resides in the air duct. In this case, a capacitor cover is used to protect the part of the capacitor in the air duct from water and dust.

For example, Japanese Unexamined Patent Publication No. 2000-173861 discloses a capacitor cover (attachment tool) with which to attach a cylindrical capacitor (aluminum electrolytic capacitor) to a housing base (main body chassis). The capacitor cover is made of plastic or other material of a predetermined hardness and a predetermined elasticity. The capacitor cover has a cylindrical shape closed at top, and in conformity to the outer shape of the capacitor to be attached, has an inner diameter approximately equal to the outer diameter of the capacitor and a length approximately equal to the length of the capacitor.

SUMMARY OF THE INVENTION

According to one aspect of the present invention, a power converting apparatus is configured to convert alternating current power into direct current power or convert direct current power into alternating current power. The power converting apparatus includes a housing, a cylindrical capacitor, and a cylindrical capacitor cover. The housing includes a housing base, a main body, and an air duct. The housing base has a first surface and a second surface. The main body includes a plurality of electronic components on the first surface of the housing base. The air duct is disposed on the second surface of the housing base, and cooling air flows through the air duct. The capacitor penetrates through the housing base so that a part of the capacitor is disposed in the main body while a rest part of the capacitor is disposed in the air duct. The capacitor cover is disposed on the housing base. The capacitor cover is closed at one end and covers the rest part of the capacitor. The capacitor cover includes an elastic material, an inner surface, and at least one groove. The inner surface defines an inner diameter approximately equal to an outer diameter of the capacitor. The at least one groove is disposed on the inner surface and extends in an axial direction of the capacitor cover.

According to another aspect of the present invention, a cylindrical capacitor cover is of a power converting apparatus. The power converting apparatus is configured to convert alternating current power into direct current power or convert direct current power into alternating current power. The power converting apparatus includes a housing base, a main body, and an air duct. The housing base has a first surface and a second surface. The main body is disposed on the first surface of the housing base. The main body includes a plurality of electronic components including a cylindrical capacitor penetrating through the housing base. The air duct is disposed on the second surface of the housing base, and cooling air flows through the air duct. A part of the capacitor is disposed in the air duct. The capacitor cover is disposed on the housing base so as to cover the part of the capacitor disposed in the air duct. The capacitor cover includes an elastic material, an inner surface, and at least one groove. The inner surface defines an inner diameter approximately equal to an outer diameter of the capacitor. The at least one groove is disposed on the inner surface in an axial direction of the capacitor cover.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
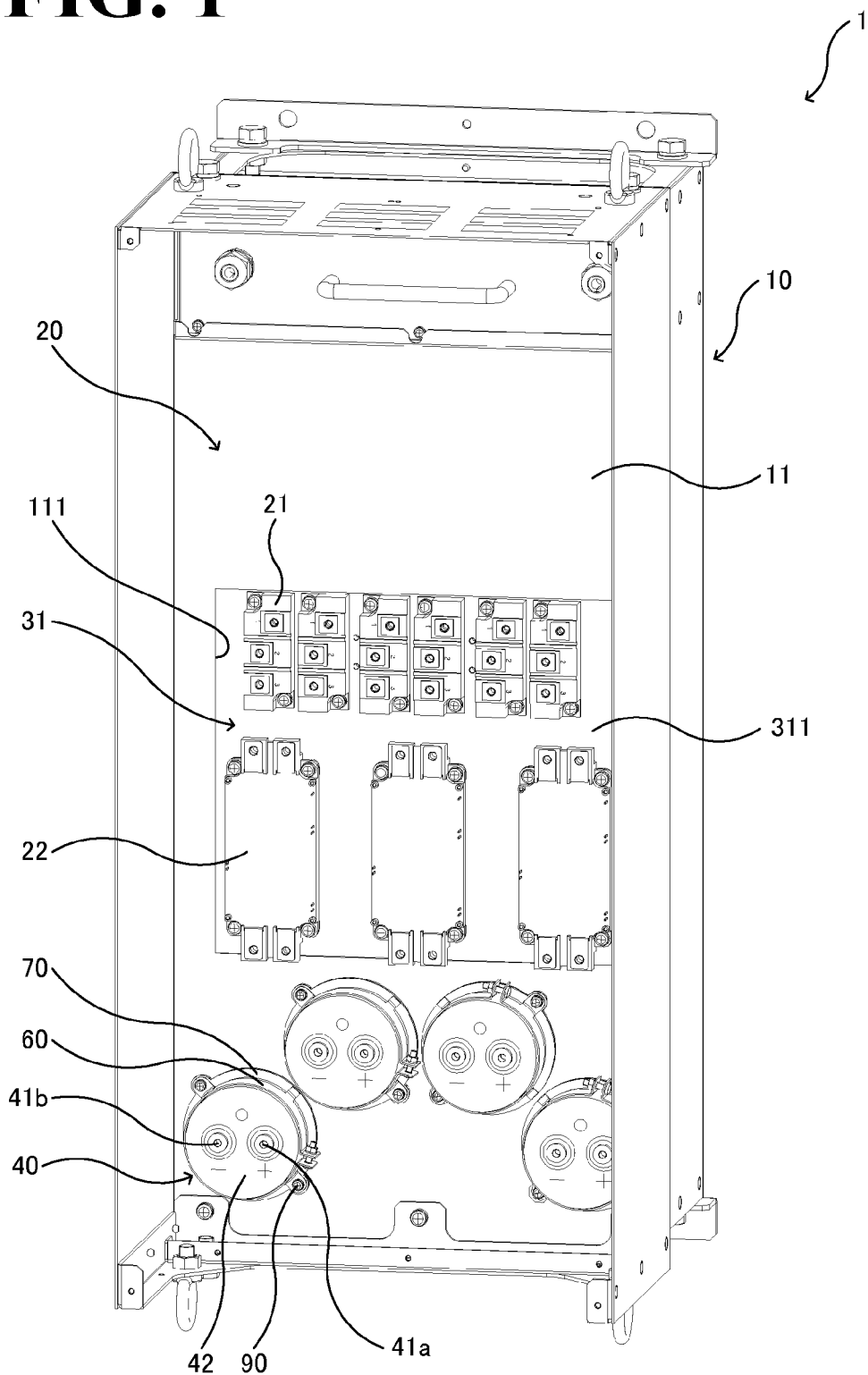
FIG. 1 is a perspective view, on the main body side, of a power converting apparatus according to an embodiment with a main body cover removed.

The embodiments will now be described with reference to the accompanying drawings, wherein like reference numerals designate corresponding or identical elements throughout the various drawings.

Figure 2:
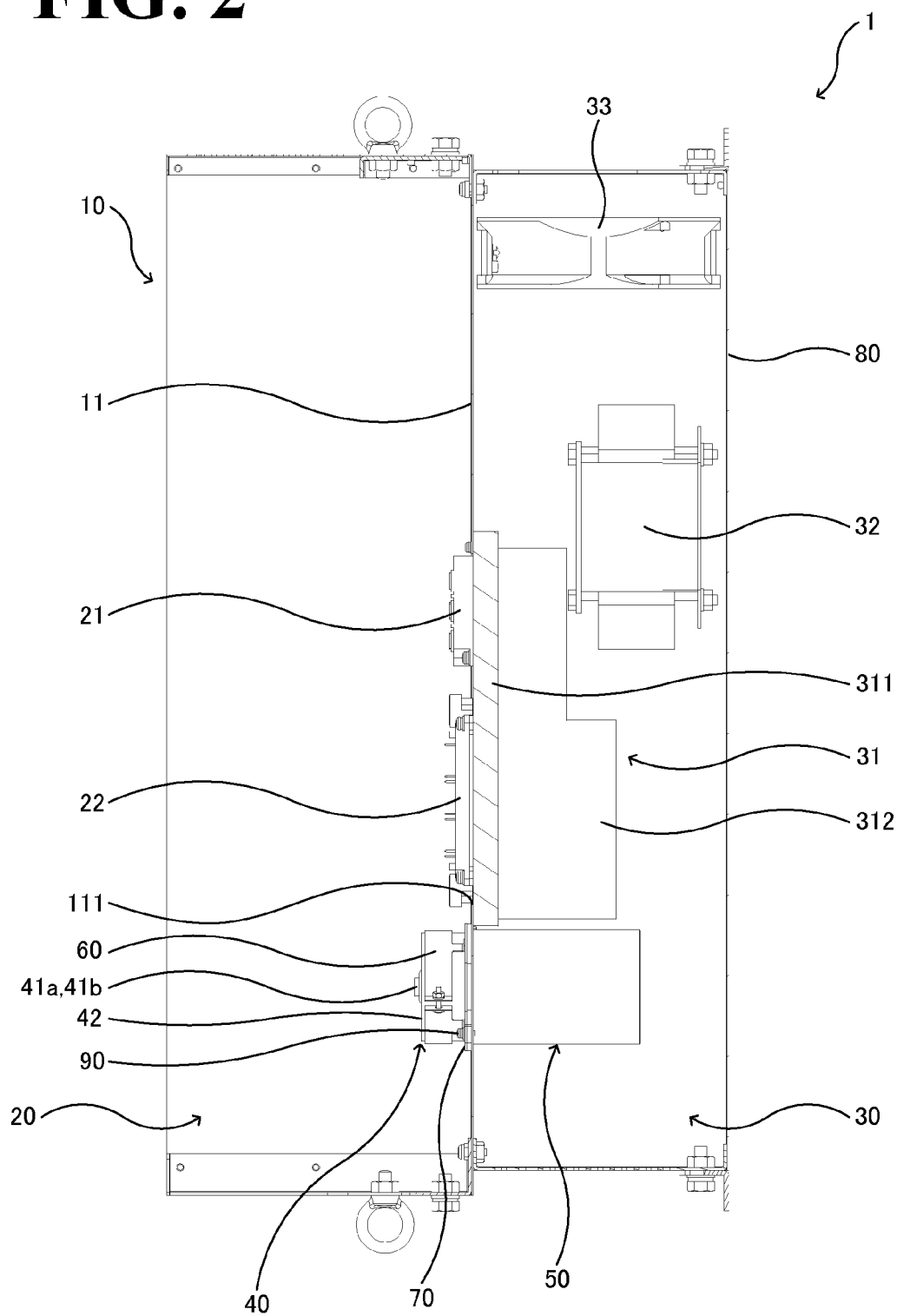
FIG. 2 is longitudinal sectional view of the power converting apparatus with the main body cover removed.

As shown in FIGS. 1 and 2, a power converting apparatus 1 according to this embodiment is an inverter to convert direct current power into alternating current power. The power converting apparatus 1 includes a housing 10, a main body 20, an air duct 30, cylindrical capacitors 40, cylindrical capacitor covers 50, annular capacitor bands 60 (securing members), annular metal plates 70, a main body cover, not shown, and an air duct cover 80. The housing 10 includes a housing base 11. The main body 20 is disposed on the front surface of the housing base 11 (in other words, on one surface of the housing base 11, as seen on the front-left side of the paper surface of FIG. 1, and the left side in FIG. 2). The air duct 30 is disposed on the rear surface of the housing base 11 (in other words, on the other surface of the housing base 11, as seen on the rear-right side of the paper surface of FIG. 1, and the right side in FIG. 2). Cooling air flows through the air duct 30. Examples of the cylindrical capacitors 40 include, but not limited to, aluminum electrolytic capacitors. The capacitor covers 50 are each closed at one end. The main body cover covers the main body 20. The air duct cover 80 covers the air duct 30.

The main body 20 includes a plurality of electronic components including diode modules 21 and power modules 22. The diode modules 21 rectify alternating current power fed from an alternating current power source, not shown, so as to covert the alternating current power into direct current power and to output the direct current power. The power modules 22 include a plurality of switching elements incorporating semiconductor devices such as IGBTs (Insulated Gate Bipolar Transistors). The plurality of switching elements repeat conductions and shutoffs in respective appropriate orders so as to output alternating current power of predetermined frequencies. The diode modules 21 and the power modules 22 are tightly secured to the front surface of a base portion 311 of a heat sink 31, described later (in other words, the surface at the front-left side of the paper surface of FIG. 1, and the surface at the left side in FIG. 2).

Figure 3:
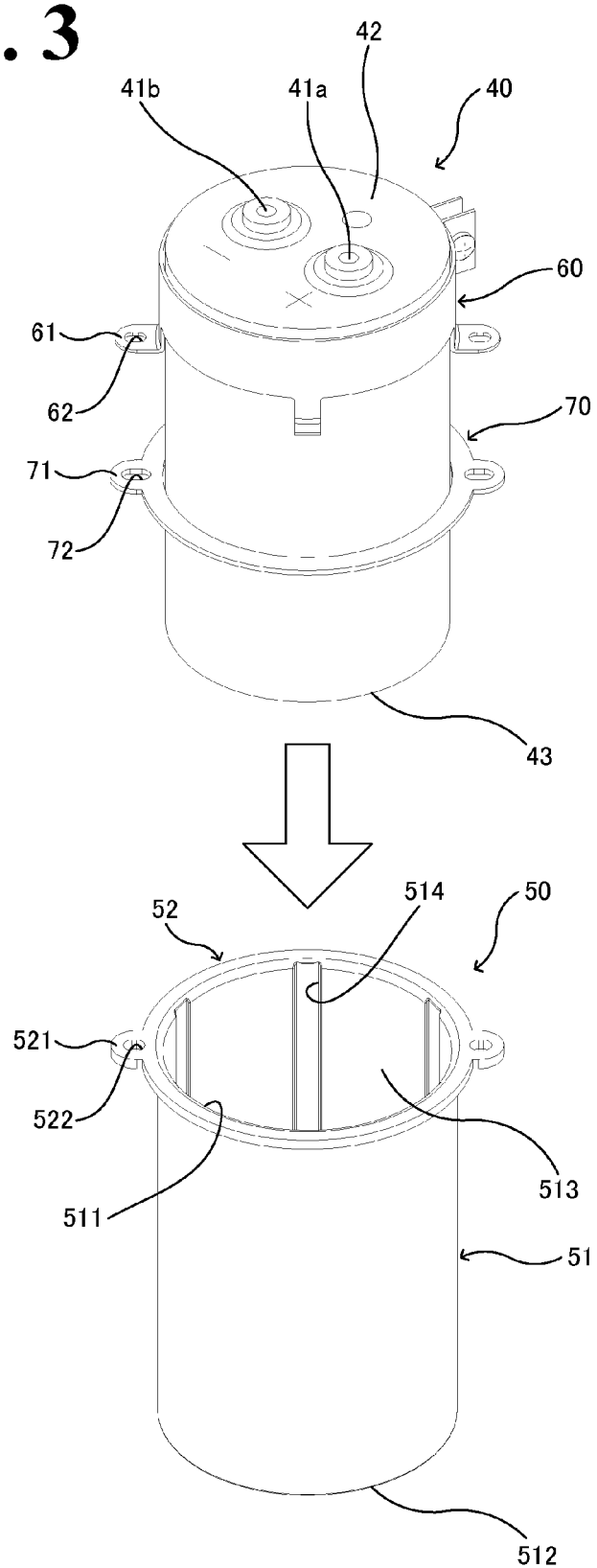
FIG. 3 shows a perspective view of a capacitor and a perspective view of a capacitor cover in a state before the capacitor is inserted into the capacitor cover.
Figure 4:
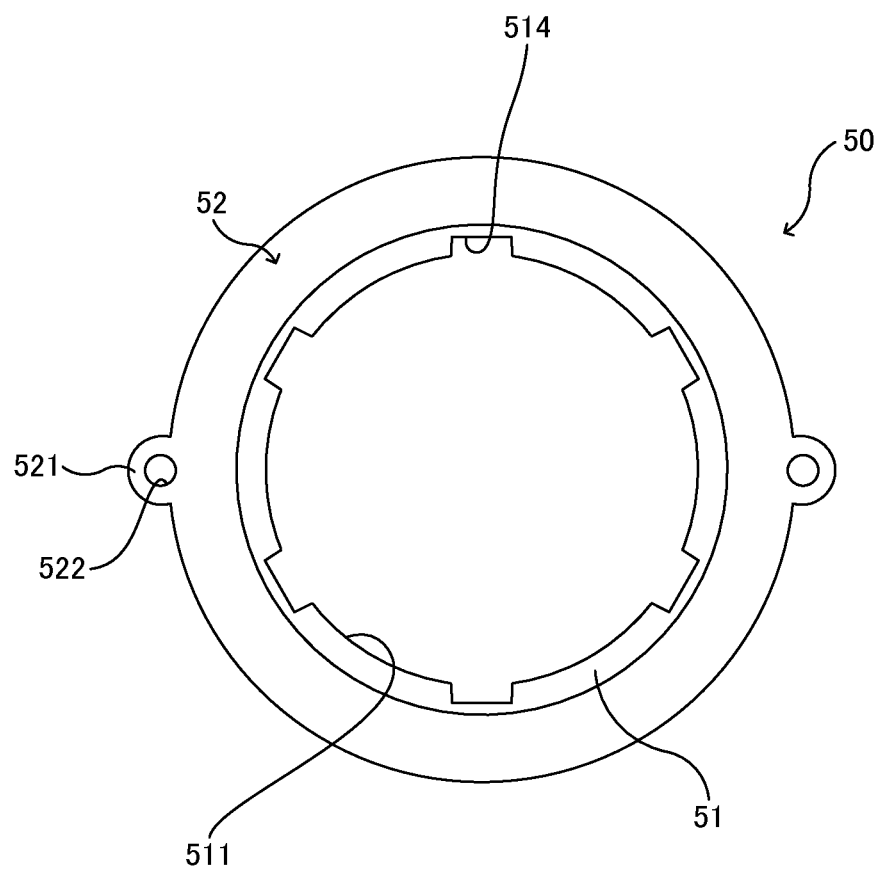
FIG. 4 is a plan view of the capacitor cover on an axial end side of a cover body.

In the air duct 30, the heat sink 31, a reactor 32, and a fan unit 33 are disposed. The reactor 32 smoothes the pulsation of the current of the direct current power converted from the alternating current power. The fan unit 33 generates cooling air. The heat sink 31 is made of a material with high heat conductivity (examples including, but not limited to, an aluminum alloy). The heat sink 31 includes a base portion 311 and a plurality of fins 312. The base portion 311 has its front surface mounted to the rear surface of the housing base 11, thus closing an opening 111 of the housing base 11. The plurality of fins 312 are upright on the rear surface of the base portion 311 (in other words, on the surface on the rear-right side of the paper surface of FIG. 1, and the surface on the right side in FIGS. 2 and 3). In the heat sink 31, the heat of the diode modules 21 and the power modules 22, which are tightly secured to the front surface of the base portion 311, is radiated through the plurality of fins 312. Thus, the diode modules 21 and the power modules 22 are cooled.

Figure 5A:
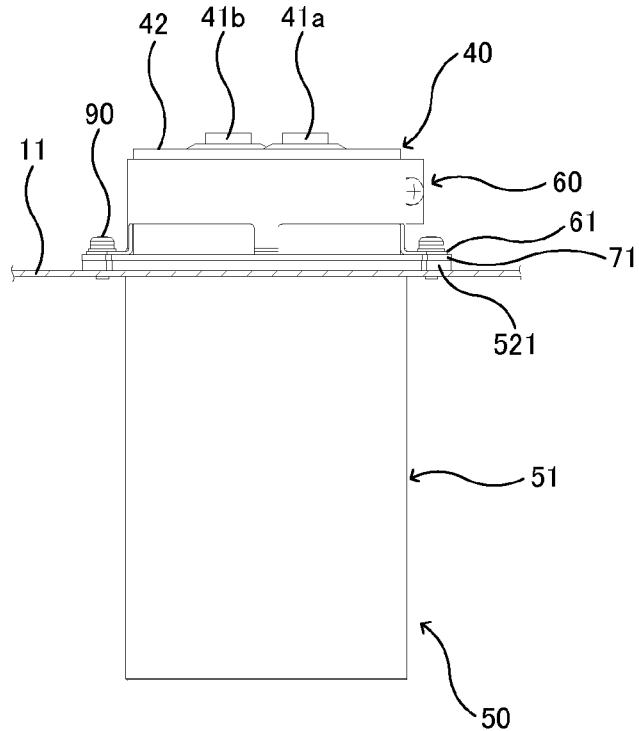
FIG. 5A is a side view of the capacitor and the capacitor cover.
Figure 5B:
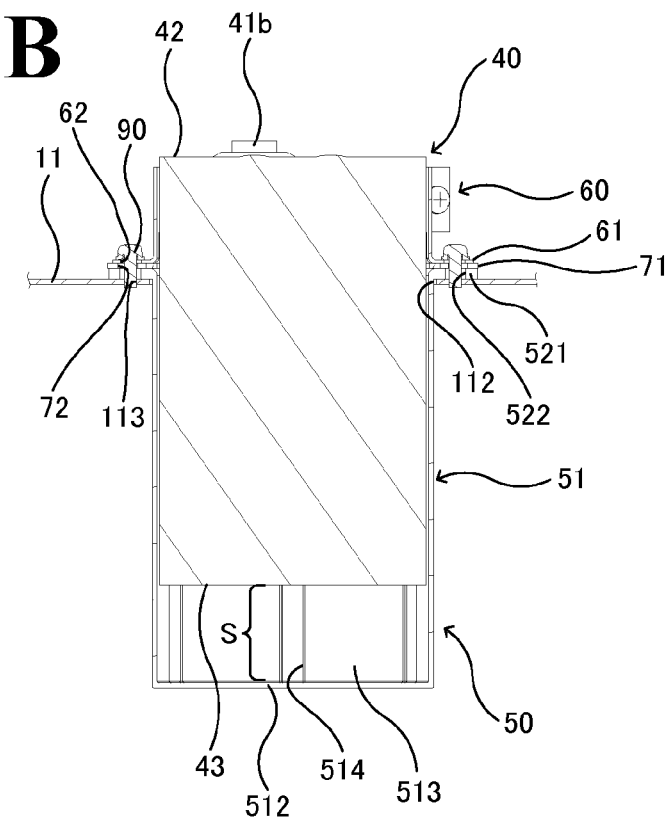
FIG. 5B is a longitudinal sectional view of the capacitor and the capacitor cover.

The capacitors 40 (such as aluminum electrolytic capacitors) smooth direct current power converted from alternating current power by the diode modules 21. Each capacitor 40 has a part that includes a top 42 and terminals 41a and 41b disposed on the top 42. The part is disposed in the main body 20 while being fitted in the capacitor band 60 and the annular metal plate 70. The rest part of the capacitor 40 includes a bottom 43 opposite the top 42 (see FIG. 3, described later) and is covered with the capacitor cover 50. The capacitor 40 penetrates through a through hole 112 (see FIG. 5B, described later) of the housing base 11 so that the rest part of the capacitor 40 covered with the capacitor cover 50 is disposed in the air duct 30. For convenience of description, the part of the capacitor 40 disposed in the main body 20 will be hereinafter referred to as the "main body 20 side part", while the rest part disposed in the air duct 30 will be referred to as the "air duct 30 side part".

The capacitor cover 50 is made of an elastic silicone rubber material (a rubber material, an elastic material). The capacitor cover 50 penetrates through the through hole 112 of the housing base 111 so as to cover the air duct 30 side part of the capacitor 40.

The capacitor band 60 and the annular metal plate 70 clamp the capacitor 40 and secure the capacitor 40 to the housing base 11.

The capacitor band 60, the annular metal plate 70, and the capacitor cover 50 (specifically, a flange 52, described later) are secured by securing screws 90 to the main body 20 side of the housing base 11, that is, to the front surface of the housing base 11. Thus, the capacitor 40 is secured to the housing base 11 with the capacitor 40 and the capacitor cover 50 (specifically, a cover body 51, described later) penetrating through the through hole 112 of the housing base 111.

The capacitor 40, the capacitor cover 50, the capacitor band 60, and the annular metal plate 70 will be described in detail by referring to FIGS. 3, 4, 5A and 5B.

As shown in FIGS. 3, 4, 5A and 5B, the capacitor band 60 is mounted to the top 42 side of the capacitor 40, which is at the main body 20 side part. The capacitor band 60 includes a plurality of approximately L-shaped protrusions 61 (in this embodiment, two protrusions) extending in the radially outward direction. The L-shaped protrusions 61 are disposed at different positions in the circumferential direction of the capacitor band 60. The protrusions 61 each have an insertion hole 62 (first insertion hole) through which one of the securing screws 90 is inserted.

The annular metal plate 70 is disposed further to the bottom 43 side than the position of the capacitor band 60, which is at the main body 20 side part of the capacitor 40. The annular metal plate 70 includes two projections 71 extending in the radially outward direction and disposed at positions corresponding to the positions of the two protrusions 61 of the capacitor band 60. The projections 71 each have an insertion hole 72 at a position corresponding to the insertion hole 62 of the corresponding one of the protrusions 61. The securing screw 90 through the insertion hole 62 is further inserted through the insertion hole 72.

The capacitor cover 50 has an opening 511 and a bottom 512, and includes a cylindrical cover body 51 and an annular flange 52 integral with the cover body 51. The cover body 51 is closed at one end and penetrates through the through hole 112 of the housing base 111. The annular flange 52 is disposed at the end of the cover body 51 at the opening 511 side and extends in the radially outward direction from the cover body 51.

The capacitor 40 is inserted in the cover body 51 with the top 42 at the opening 511 side and the bottom 43 at the bottom 512 side. The cover body 51 has an inner surface 513 defining an inner diameter approximately equal to the outer diameter of the capacitor 40. On the inner surface 513, the cover body 51 includes a plurality of grooves 514 (in this embodiment, six grooves) extending in the axial direction of the cover body 51 (in the vertical direction in FIGS. 3, 5A and 5B, and in the front-to-rear direction of the paper surface of FIG. 4). The plurality of grooves 514 are disposed at equal intervals in the circumferential direction of the inner surface 513. The plurality of grooves 514 each have an approximately rectangular shape in a plan view on an axial end side of the cover body 51. The cover body 51 covers the air duct 30 side part of the capacitor 40 with a gap S defined between the bottom 512 and the bottom 43 of the capacitor 40 in the axial direction of the capacitor cover 50.

The flange 52 includes projections 521 extending in the radially outward direction and disposed at positions corresponding to the two protrusions 61 of the capacitor band 60 and corresponding to the two projections 71 of the annular metal plate 70. The projections 521 each have an insertion hole 522 (second insertion hole) at a position corresponding to the insertion hole 62 of the corresponding one of the protrusions 61 and corresponding to the insertion hole 72 of the corresponding one of the projections 71. With the cover body 51 penetrating through the through hole 112 of the housing base 11 and with the capacitor 40 inserted in the cover body 51, the securing screws 90 are inserted through the two insertion holes 62 of the capacitor band 60, through the two insertion holes 72 of the annular metal plate 70, and through the two insertion holes 522 of the flange 52, and finally secured in two screw holes 113 on the housing base 11. Thus, the flange 52 is held between the capacitor band 60 and the housing base 11 across the annular metal plate 70, and secured to the front surface of the housing base 11 (to the main body 20 side of the housing base 11).

That is, the mounting of the capacitor 40 to the housing base 11 involves inserting the capacitor 40 into the cover body 51 of the capacitor cover 50, and inserting the cover body 51 with the capacitor 40 into the through hole 112 of the housing base 11 from the direction of the front surface of the housing base 11. Alternatively, the cover body 51 alone may be first inserted into the through hole 112, followed by insertion of the capacitor 40 into the cover body 51. Then, the securing screws 90 are inserted into the two insertion holes 62 of the capacitor band 60 and the two insertion holes 72 of the annular metal plate 70, which are mounted to the main body 20 side part of the capacitor 40. The securing screws 90 are then inserted through the two insertion holes 522 of the flange 52 of the capacitor cover 50, which is held on and in contact with the front surface of the housing base 11. The securing screws 90 are finally tightly screwed in the two screw holes 113 on the housing base 11. Thus, with the capacitor 40 and the cover body 51 penetrating through the through hole 112 of the housing base 11, the two protrusions 61 of the capacitor band 60, the two projections 71 of the annular metal plate 70, and the two projections 521 of the flange 52 are secured to the front surface of the housing base 11, and the capacitor 40 is secured to the housing base 11.

The power converting apparatus 1 according to this embodiment ensures advantageous effects that will be described in detail below. To smooth direct current power converted from alternating current power by diode modules, conventional power converting apparatuses include cylindrical capacitors with comparatively large electrostatic capacities (such as the capacitors 40 of this embodiment). To downsize the power converting apparatuses and to improve the cooling efficiency of capacitors, a commonly employed structure is that a capacitor is passed through a through hole of the housing base so that a part of the capacitor resides in the main body while the rest resides in the air duct. In this case, a capacitor cover is used to protect the part of the capacitor in the air duct from water and dust.

If the capacitor cover is made of a metal material such as aluminum, it is necessary that the capacitor cover have an inner diameter that ensures a predetermined clearance to the outer diameter of the capacitor 40. This creates a gap between the inserted capacitor and the capacitor cover, which in turn causes air insulation, resulting in degraded cooling efficiency of the capacitor 40.

An alternative to contemplate is use of a capacitor cover made of plastic or other material having a predetermined elasticity. In this case, it is common practice to make the inner diameter of the capacitor cover approximately equal to or slightly smaller than the outer diameter of the capacitor 40, so as to ensure close contact between the capacitor cover and the capacitor 40 utilizing the elasticity, in an attempt to improve the cooling efficiency. Unfortunately, since no gap exists between the capacitor 40 and the capacitor cover, no or a minimal quantity of air can escape out of the capacitor cover during insertion of the capacitor 40 into the capacitor cover, to the detriment of smooth insertion of the capacitor 40.

In view of this, this embodiment uses a capacitor cover 50 made of a silicone rubber material and having an inner surface 513 defining an inner diameter approximately equal to the outer diameter of the capacitor 40, and provides grooves 514 on the inner surface 513 in the axial direction of the capacitor cover 50. The elasticity of the silicone rubber material ensures close contact between the capacitor 40 and the capacitor cover 50. The grooves 514 permit the air inside the capacitor cover 50 to escape to the outside during insertion of the capacitor 40 into the capacitor cover 50. This ensures smooth insertion of the capacitor 40 into the capacitor cover 50 while maintaining a satisfactory level of cooling efficiency of the capacitor 40.

It is particularly noted that in this embodiment, the capacitor cover 50 has six grooves 514 disposed at equal intervals in the circumferential direction of the inner surface 513. This uniformly and circumferentially distributes the air inside the capacitor cover 50 during insertion of the capacitor 40 into the capacitor cover 50, and causes the air to be released to the outside. This, in turn, ensures smoother insertion of the capacitor 40 into the capacitor cover 50.

It is particularly noted that in this embodiment, the capacitor cover 50 is made of a silicone rubber material. This ensures a comparatively large elasticity for the capacitor cover 50. This, as a result, ensures close contact between the capacitor 40 and the capacitor cover 50 utilizing the elasticity, and improves the cooling efficiency. Additionally, since silicone rubber materials are superior in various properties including, but not limited to, elasticity, heat resistance, water repellency, electrical insulation properties, and chemical stability, the capacitor cover 50 further improves its various properties such as functionality, reliability, and deterioration resistance.

It is particularly noted that in this embodiment, the capacitor cover 50 includes a cylindrical cover body 51 closed at one end and open at another end, and an annular flange 52 integral with the cover body 51 and disposed at the opening 511 side end of the cover body 51. The cover body 51 is disposed through the through hole 112 of the housing base 11, and the flange 52 is secured to the front surface of the housing base 11. This ensures that the flange 52 covers the main body 20 side of the gap between the through hole 112 of the housing base 11 and the cover body 51, thereby sealing the through hole 112.

It is particularly noted that in this embodiment, securing screws 90 are inserted through the insertion holes 62 of the capacitor band 60, through the insertion holes 72 of the annular metal plate 70, and through the insertion holes 522 of the flange 52 of the capacitor cover 50. The securing screws 90 are finally tightly screwed in the screw holes 113 on the housing base 11. Thus, the capacitor 40 is secured to the housing base 11. In this respect, the flange 52 of the capacitor cover 50 is held between the capacitor band 60 and the housing base 11 across the annular metal plate 70, ensuring that the capacitor cover 50 is also secured to the housing base 11. Additionally, the securing screws 90 bring the flange 52 into close contact with the housing base 11, thereby improving the sealability of the through hole 112 of the housing base 11.

It is particularly noted that in this embodiment, the cover body 51 covers the air duct 30 side part of the capacitor 40 with a gap S defined between the bottom 512 and the bottom 43 of the capacitor 40 in the axial direction of the capacitor cover 50. That is, the cover body 51 has a dimensional margin in the axial direction of the cylinder. This ensures that a single kind of cover body 51 serves a plurality of kinds of capacitors 40 of different axial lengths, thereby improving the versatility of the capacitor cover 50.

Modifications will be described below.

(1) Groove Variations

In the above-described embodiment, the grooves 514 on the inner surface 513 of the cover body 51 of the capacitor cover 50 each have an approximately rectangular shape in a plan view on an axial end side of the cover body 51. This, however, should not be construed in a limiting sense. Other than the approximately rectangular shape in the above-described embodiment, the following shapes are contemplated for the grooves 514 on the inner surface 513 of the cover body 51.

Figure 6A:
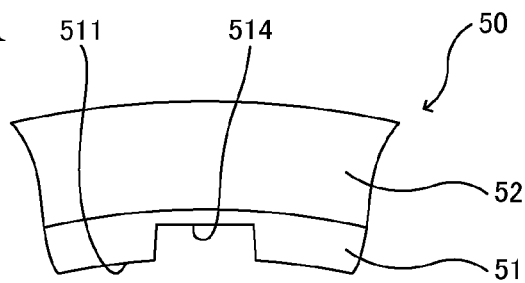
FIGS. 6A, 6B, 6C, and 6D are plan views of the capacitor cover on the axial end side of the cover body according to modifications with varied shapes of grooves.

FIG. 6A shows, for comparison, the shape of a groove 514 on the inner surface 513 of the cover body 51 in the above-described embodiment. As shown in FIG. 6A, each groove 514 on the inner surface 513 of the cover body 51 in the above-described embodiment has an approximately rectangular shape in a plan view on an axial end side of the cover body 51.

Figure 6B:
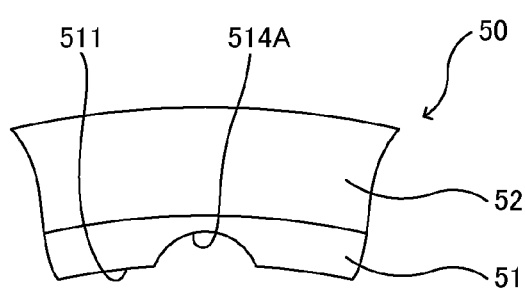

FIG. 6B shows another exemplary shape of a groove 514A on the inner surface 513 of the cover body 51. In the example shown in FIG. 6B, each groove 514A on the inner surface 513 of the cover body 51 has an approximately semicircular shape in a plan view on an axial end side of the cover body 51.

Figure 6C:
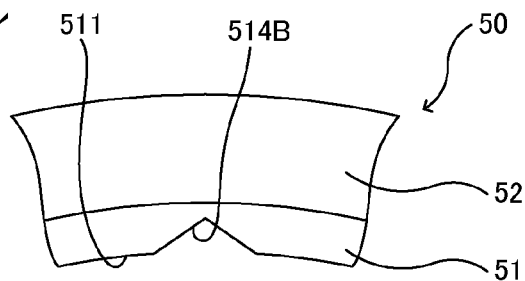

FIG. 6C shows another exemplary shape of a groove 514B on the inner surface 513 of the cover body 51. In the example shown in FIG. 6C, each groove 514B on the inner surface 513 of the cover body 51 has an approximately triangle shape in a plan view on an axial end side of the cover body 51.

Figure 6D:
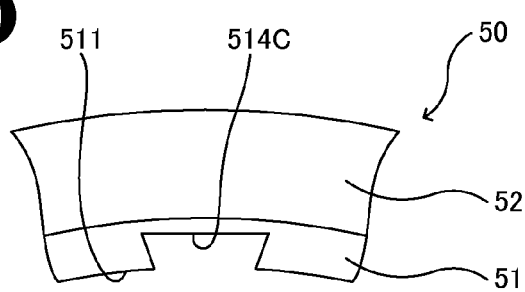

FIG. 6D shows another exemplary shape of a groove 514C on the inner surface 513 of the cover body 51. In the example shown in FIG. 6D, each groove 514C on the inner surface 513 of the cover body 51 has an approximately inverted-trapezoidal shape in a plan view on an axial end side of the cover body 51.

Employing grooves shaped as shown either in FIG. 6B, FIG. 6C, or FIG. 6D on the inner surface 513 of the cover body 51 ensures similar advantageous effects to those in the above-described embodiment. The shapes of the grooves on the inner surface 513 of the cover body 51 will not be limited to those shown in FIGS. 6A to 6D. It is also possible to use any other shapes.

(2) Other Embodiments

In the above-described embodiment, the capacitor cover 50 includes six grooves 514 extending in the axial direction of the capacitor cover 50 and disposed at equal intervals in the circumferential direction of the inner surface 513. This, however, should not be construed in a limiting sense. The cover body 51 may include at least one groove on the inner surface 513. Additionally, any of the grooves on the inner surface 513 may be bent somewhat along the length of the grooves.

While in the above-described embodiment the capacitor cover 50 is made of a silicone rubber material, this should not be construed in a limiting sense. The capacitor cover 50 may be made of a rubber material other than silicone rubber materials. Examples include, but not limited to, polychloroprene rubber and ethylene propylene rubber. Alternatively, the capacitor cover 50 may be made of an elastic material other than rubber materials. Examples include, but not limited to, elastic plastics.

While in the above-described embodiment the power converting apparatus 1 is an inverter to convert direct current power into alternating current power, this should not be construed in a limiting sense. The power converting apparatus may be a converter to convert alternating current power into direct current power.

It will be appreciated that various embodiments and modifications described herein may be readily combined.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power converting apparatus configured to convert alternating current power into direct current power or convert direct current power into alternating current power, the power converting apparatus comprising:
    a housing comprising:
        a housing base having a first surface and a second surface;
        a main body comprising a plurality of electronic components on the first surface of the housing base; and
        an air duct through which cooling air flows on the second surface of the housing base;
    a cylindrical capacitor penetrating through the housing base so that a part of the capacitor is disposed in the main body while a rest part of the capacitor is disposed in the air duct; and
    a cylindrical capacitor cover on the housing base, the capacitor cover covering the rest part of the capacitor, the capacitor cover comprising:
        an elastic material;
        a cylindrical capacitor cover body being closed at one end and open at another end;
        an inner surface defining an inner diameter approximately equal to an outer diameter of the capacitor such that the inner surface of the capacitor cover is in close contact with an outer surface of the capacitor when the capacitor cover is provided over the rest part of the capacitor;
        at least one groove, on the inner surface, extending in an axial direction of the capacitor cover; and
        an annular flange directly connected to and extending in a radially outward direction from the another end that is open,
    wherein the one end of the capacitor cover that is closed being provided within the air duct, and the annular flange directly abuts and is secured to the first surface of the housing base.

2. The power converting apparatus according to claim 1, wherein the at least one groove of the capacitor cover comprises a plurality of grooves circumferentially spaced on the inner surface of the capacitor cover at equal intervals.

3. The power converting apparatus according to claim 2, wherein the capacitor cover comprises a rubber material.

4. The power converting apparatus according to claim 3, wherein the capacitor cover comprises a silicon rubber material.

5. The power converting apparatus according to claim 2, wherein the at least one groove being disposed on the cover body, and an annular flange integral with the cover body, and wherein the cover body is disposed through the housing base, and the flange is secured to the first surface of the housing base.

6. The power converting apparatus according to claim 5, further comprising an annular securing member clamping the capacitor and securing the capacitor to the housing base, the securing member comprising a plurality of first insertion holes, through which securing screws are inserted, at different positions in a circumferential direction of the securing member,
    wherein the flange comprises a plurality of second insertion holes, through which the securing screws are inserted, at different positions respectively corresponding to the positions of the first insertion holes of the securing member, and wherein the flange is held between the securing member and the housing base with the securing screws secured to the housing base through the respective first insertion holes and the respective second insertion holes.

7. The power converting apparatus according to claim 1, wherein the elastic material of the capacitor cover comprises a rubber material.

8. The power converting apparatus according to claim 7, wherein the rubber material of the capacitor cover comprises a silicone rubber material.

9. The power converting apparatus according to claim 7, wherein the at least one groove being disposed on the cover body, and an annular flange integral with the cover body, and wherein the cover body is disposed through the housing base, and the flange is secured to the first surface of the housing base.

10. The power converting apparatus according to claim 9, further comprising an annular securing member clamping the capacitor and securing the capacitor to the housing base, the securing member comprising a plurality of first insertion holes, through which securing screws are inserted, at different positions in a circumferential direction of the securing member, wherein the flange comprises a plurality of second insertion holes, through which the securing screws are inserted, at different positions respectively corresponding to the positions of the first insertion holes of the securing member, and wherein the flange is held between the securing member and the housing base with the securing screws secured to the housing base through the respective first insertion holes and the respective second insertion holes.

11. The power converting apparatus according to claim 1, wherein the at least one groove being disposed on the cover body, and an annular flange integral with the cover body, and wherein the cover body is disposed through the housing base, and the flange is secured to the first surface of the housing base.

12. The power converting apparatus according to claim 11, further comprising an annular securing member clamping the capacitor and securing the capacitor to the housing base, the securing member comprising a plurality of first insertion holes, through which securing screws are inserted, at different positions in a circumferential direction of the securing member, wherein the flange comprises a plurality of second insertion holes, through which the securing screws are inserted, at different positions respectively corresponding to the positions of the first insertion holes of the securing member, and wherein the flange is held between the securing member and the housing base with the securing screws secured to the housing base through the respective first insertion holes and the respective second insertion holes.

13. The power converting apparatus according to claim 11, wherein the cover body covers the rest part of the capacitor with a predetermined gap defined between a bottom of the capacitor and the closed end of the cover body in the axial direction of the capacitor cover.

14. The power converting apparatus according to claim 1, wherein the at least one groove defines an open air passage between the capacitor and the capacitor cover, each of the at least one groove having an end that that is open, the open end of the at least one groove located in the main body.

15. A cylindrical capacitor cover of a power converting apparatus, the power converting apparatus being configured to convert alternating current power into direct current power or convert direct current power into alternating current power, the power converting apparatus comprising:

a housing base having a first surface and a second surface;

a main body on the first surface of the housing base, the main body comprising a plurality of electronic components including a cylindrical capacitor penetrating through the housing base; and an air duct through which cooling air flows on the second surface of the housing base, wherein a part of the capacitor is disposed in the air duct, wherein the capacitor cover is disposed on the housing base so as to cover the part of the capacitor disposed in the air duct, the capacitor cover comprising:

an elastic material;

a cylindrical cover body that is closed at the one end and open at another end;

an inner surface defining an inner diameter approximately equal to an outer diameter of the capacitor such that the inner surface of the capacitor cover is in close contact with an outer surface of the capacitor when the capacitor cover is provided over the part of the capacitor;

at least one groove, on the inner surface, extending in an axial direction of the capacitor cover; and an annular flange directly connected to and extending in a radially outward direction from the another end that is open, wherein the one end of the cover body that is closed being provided within the air duct, and the annular flange directly abuts and is secured to the first surface of the housing base.

16. The cylindrical capacitor cover according to claim 15, wherein the at least one groove defines an open air passage between the capacitor and the capacitor cover, each of the at least one groove having an end that that is open, the open end of the at least one groove located in the main body.

* * * * *